United States Patent
Chen

(10) Patent No.: US 10,930,240 B2
(45) Date of Patent: Feb. 23, 2021

(54) DISPLAY PANEL DRIVING METHOD AND DRIVING DEVICE

(71) Applicants: HKC CORPORATION LIMITED, Shuitian Village (CN); CHONGQING HKC OPTOELECTRONICS TECHNOLOGY CO., LTD., Chongqing (CN)

(72) Inventor: Yu-Jen Chen, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/475,517

(22) PCT Filed: Sep. 1, 2017

(86) PCT No.: PCT/CN2017/100256
§ 371 (c)(1),
(2) Date: Jul. 2, 2019

(87) PCT Pub. No.: WO2019/000635
PCT Pub. Date: Jan. 3, 2019

(65) Prior Publication Data
US 2019/0325839 A1 Oct. 24, 2019

(30) Foreign Application Priority Data
Jun. 29, 2017 (CN) .......................... 201710516337.1

(51) Int. Cl.
*G09G 3/36* (2006.01)
*G02F 1/1368* (2006.01)
*H01L 27/12* (2006.01)

(52) U.S. Cl.
CPC ......... *G09G 3/3696* (2013.01); *G02F 1/1368* (2013.01); *G09G 3/3677* (2013.01); *G09G 3/3688* (2013.01); *H01L 27/124* (2013.01); *H01L 27/1218* (2013.01)

(58) Field of Classification Search
None
See application file for complete search history.

(56) References Cited

U.S. PATENT DOCUMENTS

| 2015/0002497 A1* | 1/2015 | Dong | G09G 3/3655 345/211 |
| 2015/0022510 A1* | 1/2015 | Yao | G09G 3/3659 345/211 |
| 2017/0301706 A1* | 10/2017 | Kadowaki | G03F 7/0007 |

* cited by examiner

*Primary Examiner* — Brian M Butcher
(74) *Attorney, Agent, or Firm* — Wang Law Firm, Inc.

(57) ABSTRACT

A display panel driving method, a driving device, and display device. The driving method includes steps of: performing a display, turning on first switch transistor and second switch transistor under control of first scanning line, and turning off third switch transistor under control of the second switch line, and inputting a data signal from data line to first pixel electrode and second pixel electrode through the first switch transistor and the second switch transistor and driving the pixel structure where the first pixel electrode and the second pixel electrode are located to display, and turning the third switch transistor under control of second scanning line and turning off the first switch transistor and the second switch transistor under control of the first scanning line to establish a preset voltage difference between the first pixel electrode and the second pixel electrode.

15 Claims, 10 Drawing Sheets

When performing a three dimensional display, turning on the third switch tube under a control of the second scan line and turning off the first switch tube and the second switch tube under a control of the first scan line and controlling the common voltage signal line to input a common voltage signal to the auxiliary electrode through the third electrode of the third switch tube — 210

Turning on the first switch tube and the second switch tube under a control of the first scan line and turning off the third switch tube under a control of the second scan line and sending a data signal from the data line through the first switch tube and the second switch tube to the first pixel electrode and the second pixel electrode and driving the first pixel electrode and the second pixel electrode to carry out a display — 220

The first switch tube and the second switch tube under the control of a first scan line turns off the third switch tube under the control of a second scan line, sending a data signal from the data line through the first switch tube and the second switch tube to a first pixel electrode and a second pixel electrode. This drives the first pixel electrode and the second pixel electrode to develop a display in a pixel unit in plane display operation ~110

The third switch tube under the control of the second scan line and turns off the first switch tube and the second switch tube under the control of the first scan line and establishes a preset voltage difference between the first pixel electrode and the second pixel electrode through the auxiliary electrode ~120

FIG. 1

When performing a three dimensional display, turning on the third switch tube under a control of the second scan line and turning off the first switch tube and the second switch tube under a control of the first scan line and controlling the common voltage signal line to input a common voltage signal to the auxiliary electrode through the third electrode of the third switch tube ⌐~210

Turning on the first switch tube and the second switch tube under a control of the first scan line and turning off the third switch tube under a control of the second scan line and sending a data signal from the data line through the first switch tube and the second switch tube to the first pixel electrode and the second pixel electrode and driving the first pixel electrode and the second pixel electrode to carry out a display ⌐~220

FIG. 5

DISPLAY PANEL DRIVING METHOD AND DRIVING DEVICE

CROSS-REFERENCES TO RELATED PATENT APPLICATION

This application is a National Stage Application of PCT International Patent Application No. PCT/CN2017/100256 filed on Sep. 1, 2017, under 35 U.S.C. § 371, which claims priority to and the benefit of Chinese Patent Application No. 201710516337.1, filed on Jun. 29, 2017, and the disclosure of which is incorporated herein in its entirety by reference.

BACKGROUND OF THE INVENTION

1. Field of the Invention

The present invention relates to display technology area and especially relates to a driving method of display panels, a driving device, and a display device.

2. Description of the Related Art

A typical problem related to liquid-crystal display panels is that they tend to have color shift problems, which becomes more pronounced in liquid-crystal panels of larger screen area and becomes much more obvious with screens of a larger viewing angle. In order to improve the viewing angle and, at the same time, reduce color shift of these display panels, each pixel unit in liquid-crystal display panels is generally divided into a primary pixel electrode and a secondary pixel electrode, and a storage capacitor is disposed and is electrically connected to the secondary pixel electrode through a switch transistor. A scanning line is used to turn on the switch transistors, which are respectively and electrically connected to the primary pixel electrode and the secondary pixel electrode, and a data line provides data signals to the primary pixel electrode and the secondary pixel electrode. Then, the switch transistor between the storage capacitor and the secondary pixel electrode controls the operation to establish an electrical connection between the secondary pixel electrode and the storage capacitor to release a portion of the capacitor charge on the secondary pixel electrode to the storage capacitor. These lead to a voltage difference between the primary pixel electrode and the secondary pixel electrode differentiating the angles of liquid crystals, thereby fulfilling the purpose of reducing color shift.

However, the electrodes of the storage capacitor are typically made of metal, and the adoption of a storage capacitor occupies a portion of the pixel electrode area, thereby lowering the aperture ratio of the liquid-crystal display panel.

SUMMARY OF THE INVENTION

On account of the aforementioned problem, the present invention provides a driving method of a display panel, a driving device, and a display device to achieve the reduction of color shift without affecting the aperture ratio of the liquid-crystal display panel.

In a first aspect, the present invention provides the driving method of the display panel, wherein the display panel comprises:
a plurality of data lines;
a plurality of first scanning lines;
a plurality of second scanning lines;
a plurality of pixel units, wherein each of the pixel units includes a first pixel electrode, a second pixel electrode, and an auxiliary electrode made of a same material;
a plurality of first switch transistors disposed corresponding to the first pixel electrodes, wherein the control electrode of the first switch transistor is electrically connected to the first scanning line, and a first electrode of the first switch transistor is electrically connected to the data line, and a second electrode of the first switch transistor is electrically connected to a corresponding one of the first pixel electrodes;
a plurality of second switch transistors disposed corresponding to the second pixel electrodes, wherein a control electrode of the second switch transistor is electrically connected to the first scanning line, and a first electrode of the second switch transistor is electrically connected to the data line electrically connected by the first switch transistor, and a second electrode of the second switch transistor is electrically connected to a corresponding one of the second pixel electrodes;
a plurality of third switch transistors disposed corresponding to the auxiliary electrodes, wherein a control electrode of the third switch transistor is electrically connected to the second scanning line, and a first electrode of the third switch transistor is electrically connected to the second pixel electrode of a same one of the pixel units, and a second electrode of the third switch transistor is electrically connected to a corresponding one of the auxiliary electrodes;
the driving method comprises:
when performing a two dimensional display, turning on the first switch transistor and the second switch transistor under control of the first scanning line and turning off the third switch transistor under control of the second scanning line, such that a data line inputs a data signal to the first pixel electrode and the second pixel electrode through the first switch transistor and the second switch transistor, thereby driving the first pixel electrode and the second pixel electrode in the pixel unit to display in the pixel unit; and
turning on the third switch transistor under control of the second scanning line such that the second pixel electrode is in conduction with the auxiliary electrode, and turning off the first switch transistor and the second switch transistor under control of the first scanning line, such that a portion of the charge in the second pixel electrode is transferred to the auxiliary electrode, thereby establishing a preset voltage difference between the first pixel electrode and the second pixel electrode.

In a second aspect, the present invention provides a driving device of a display panel, which comprises:
a driver module configured to, when performing a two dimensional display, turn on a first switch transistor and a second switch transistor under control of a first scanning line, as well as turn off a third switch transistor under control of a second scanning line, such that a data line inputs a data signal to a first pixel electrode and a second pixel electrode through the first switch transistor and the second switch transistor, thereby driving the first pixel electrode and the second pixel electrode to display in a pixel unit;
a voltage control module configured to turn on the third switch transistor under control of the second scanning line, as well as turn off the first switch transistor and the second switch transistor under control of the first scanning line, such that a portion of charges in the second pixel electrode is transferred to the auxiliary electrode, thereby establishing a preset voltage difference between the first pixel electrode and the second pixel electrode;

wherein the display panel comprises an array substrate, comprising:

a plurality of data lines;

a plurality of first scanning lines;

a plurality of second scanning lines;

a plurality of pixel units, wherein each of the pixel units includes the first pixel electrode, the second pixel electrode, and the auxiliary electrode made of a same material;

a plurality of the first switch transistors disposed corresponding to the first pixel electrodes, wherein the control electrode of the first switch transistor is electrically connected to the first scanning line, and a first electrode of the first switch transistor is electrically connected to the data line, and a second electrode of the first switch transistor is electrically connected to a corresponding one of the first pixel electrodes;

a plurality of the second switch transistors disposed corresponding to the second pixel electrodes, wherein the control electrode of the second switch transistor is electrically connected to the first scanning line, and a first electrode of the second switch transistor is electrically connected to the data line electrically connected by the first switch transistor, and a second electrode of the second switch transistor is electrically connected to the corresponding second pixel electrode;

a plurality of the third switch transistors disposed corresponding to the auxiliary electrodes, wherein the control electrode of the third switch transistor is electrically connected to the second scanning line, and a first electrode of the third switch transistor is electrically connected to the second pixel electrode of a same one of the pixel units, and the second electrode of the third switch transistor is electrically connected to a corresponding one of the auxiliary electrodes.

In a third aspect, the present invention provides another driving device of a display panel, which comprises:

a driver module configured to, when performing a two dimensional display, turn on a first switch transistor and a second switch transistor under control of a first scanning line, as well as turn off a third switch transistor under control of a second scanning line, such that a data line inputs a data signal to a first pixel electrode and a second pixel electrode through the first switch transistor and the second switch transistor, thereby driving the first pixel electrode and the second pixel electrode to display in a pixel unit; and a voltage control module configured to turn on the third switch transistor under control of the second scanning line and turn off the first switch transistor and the second switch transistor under control of the first scanning line to have a portion of the charge in the second pixel electrode transferred to the auxiliary electrode, thereby establishing a preset voltage difference between the first pixel electrode and the second pixel electrode;

wherein the display panel comprises an array substrate, comprising:

a plurality of data lines;

a plurality of first scanning lines;

a plurality of second scanning lines;

a plurality of pixel units, wherein each of the pixel units includes the first pixel electrode, the second pixel electrode, and the auxiliary electrode made of a same material;

a plurality of the first switch transistors disposed corresponding to the first pixel electrodes, wherein the control electrode of the first switch transistor is electrically connected to the first scanning line, and a first electrode of the first switch transistor is electrically connected to the data line, and a second electrode of the first switch transistor is electrically connected to a corresponding one of the first pixel electrodes;

a plurality of the second switch transistors disposed corresponding to the second pixel electrodes, wherein the control electrode of the second switch transistor is electrically connected to the first scanning line, and a first electrode of the second switch transistor is electrically connected to the data line electrically connected by the first switch transistor, and a second electrode of the second switch transistor is electrically connected to a corresponding one of the second pixel electrodes;

a plurality of the third switch transistors disposed corresponding to the auxiliary electrodes, wherein the control electrode of the third switch transistor is electrically connected to the second scanning line, and a first electrode of the third switch transistor is electrically connected to a second pixel electrode of a same one of the pixel units, and the second electrode of the third switch transistor is electrically connected to a corresponding one of the auxiliary electrodes;

wherein the first pixel electrode, the second pixel electrode, and the auxiliary electrode can respectively connect in parallel to at least one capacitor disposed in a non-display area of the display panel.

In a fourth aspect, the present invention provides a display device including a display panel and any one of the aforementioned driving devices.

The present invention also provides a computer readable storage medium, storing computer executable instructions for carrying out the aforementioned driving methods of display panels.

The present invention also provides a driving device including one or more processors, memory, and one or more programs being stored in the memory, and when the programs are processed by the processors, the aforementioned driving methods of display panels are being executed.

The present invention also provides a computer program product including a computer program stored on a computer readable non-transitory storage medium, and the computer program includes instructions, and when the instructions are processed by a computer, the computer executes any one of the aforementioned methods.

BRIEF DESCRIPTION OF THE DRAWINGS

FIG. 1 is a schematic diagram showing a flow chart of a driving method of a display panel provided in the present embodiment;

FIG. 5 is a schematic diagram showing a flow chart of another driving method of a display panel provided in the present embodiment;

DESCRIPTION OF THE PREFERRED EMBODIMENTS

FIG. 1 is a schematic diagram showing a flow chart of a driving method of a display panel provided in the present embodiment, wherein the driving method is applicable on a situation that requires driving the display panel to display two-dimensionally.

The method includes a step 110 of, when performing a two dimensional display, turning on a first switch transistor and a second switch transistor under control of a first scanning line, and turning off a third switch transistor under control of a second scanning line, so as to send a data signal from a data line through the first switch transistor and the second switch transistor to a first pixel electrode and a second pixel electrode, thereby driving the first pixel electrode and the second pixel electrode to display in a pixel unit.

Figure 2:
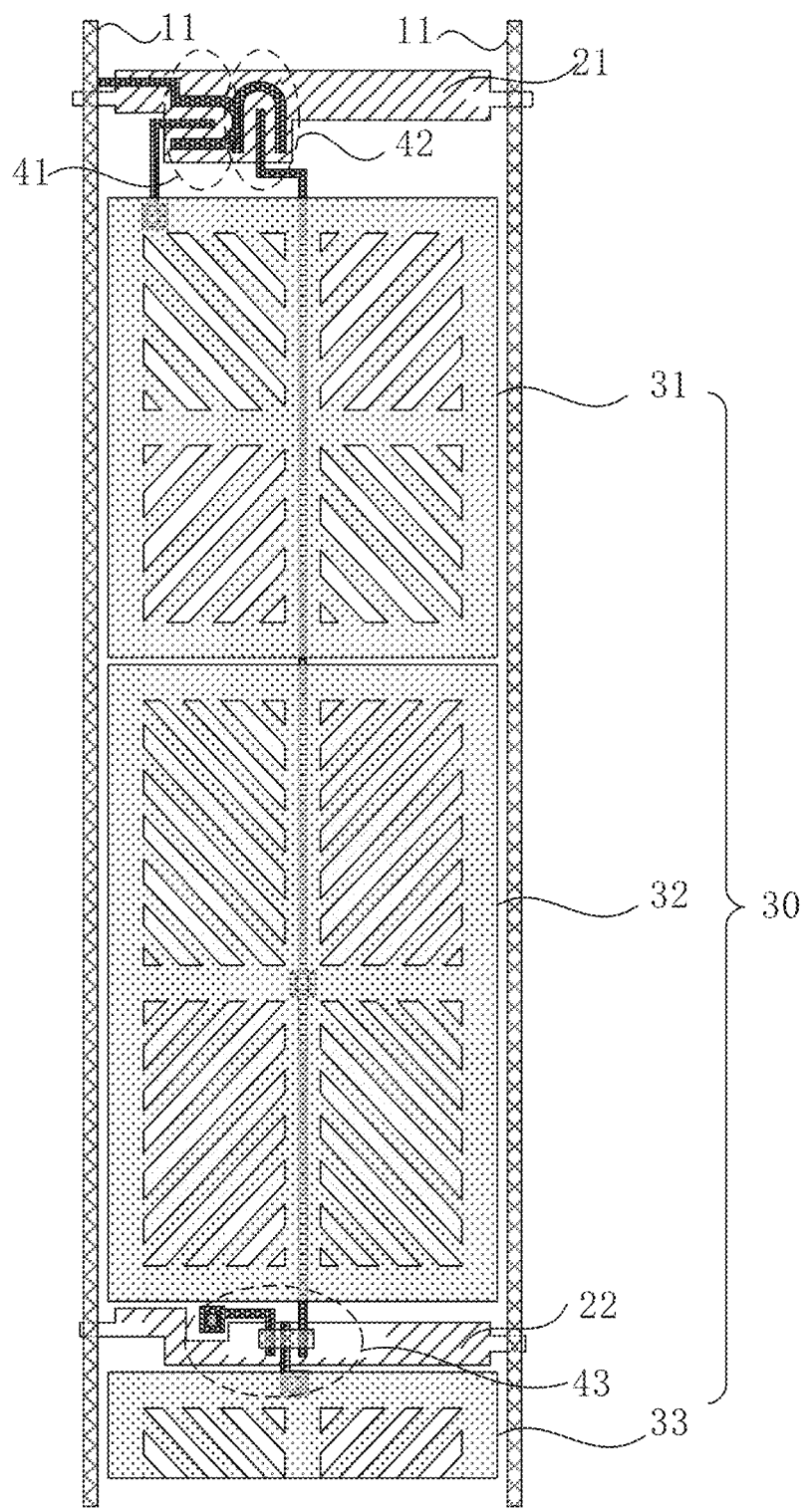
FIG. 2 is a schematic diagram showing a top view of an array substrate structure provided in the present embodiment.
Figure 3:
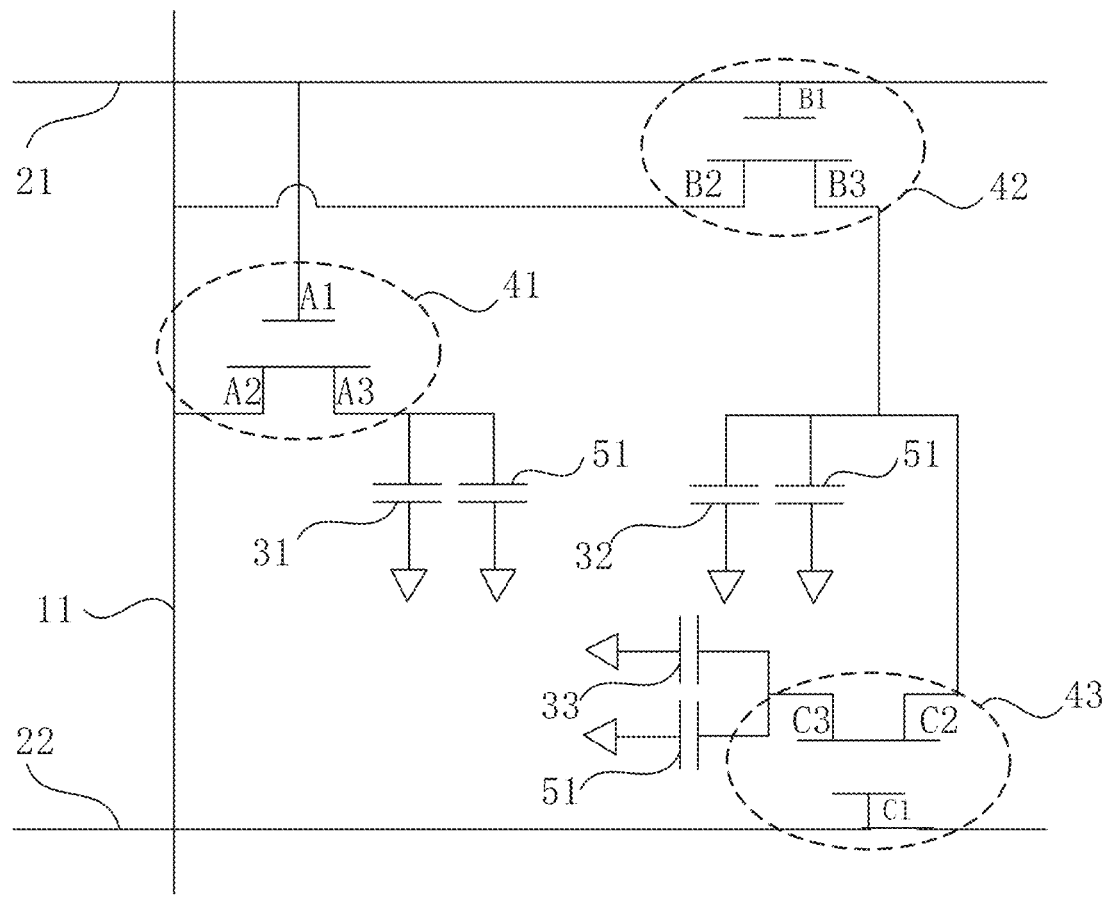
FIG. 3 is an equivalent schematic diagram of a pixel unit in an array substrate provided in the present embodiment.

FIG. 2 is a schematic diagram showing an array substrate structure provided in the present embodiment, and FIG. 3 is an equivalent circuit diagram of a pixel unit in an array substrate provided in the present embodiment. In combination of FIG. 2 and FIG. 3, the array substrate includes a plurality of data lines 11, a plurality of first scanning lines 21, a plurality of second scanning lines 22, a plurality of pixel units 30, a plurality of first switch transistors 41, a plurality of second switch transistors 42, and a plurality of third switch transistors 43.

Wherein, every pixel unit 30 includes a first pixel electrode 31, a second pixel electrode 32, and an auxiliary electrode 33 made of the same material. The first switch transistor 41 and the first pixel electrode 31 are correspondingly disposed, and the control electrode A1 of the first switch transistor 41 is electrically connected to the first scanning line 21, and a first electrode A2 is electrically connected to the data line 11, and a second electrode A3 is electrically connected to the corresponding first pixel electrode 31. The second switch transistor 42 and the second pixel electrode 32 are correspondingly disposed, and the control electrode B1 of the second switch transistor 42 is electrically connected to the first scanning line 21, and a first electrode B2 is electrically connected to the data line 11 electrically connected by the first switch transistor 41, and a second electrode B3 is electrically connected to the corresponding second pixel electrode 32. The third switch transistor 43 and the auxiliary electrode 33 are correspondingly disposed, and the control electrode C1 of the third switch transistor 43 is electrically connected to the second scanning line 22, and a first electrode C2 is electrically connected to the second pixel electrode 32 located in the same pixel unit 30, and a second electrode C3 is electrically connected to the corresponding auxiliary electrode 33.

The first scanning line 21 controls turning on the first switch transistor 41 and the second switch transistor 42. The second scanning line 22 controls to turning off the third switch transistor 43. The data line 11 inputs a data signal to the first pixel electrode 31 and the second pixel electrode 32, and the first pixel electrode 31 and the second pixel electrode 32 at this moment carry on a display for the pixel unit and have the same voltage.

The method includes a step 120, turning on the third switch transistor under control of the second scanning line and turning off the first switch transistor and the second switch transistor under control of the first scanning line, thereby establishing a preset voltage difference between the first pixel electrode and the second pixel electrode through the auxiliary electrode.

In combination of FIG. 2 and FIG. 3, the second scanning line 22 turns on the third switch transistor 43, and the first scanning line 21 turns off the first switch transistor 41 and the second switch transistor 42, a portion of the charge on the second pixel electrode 32 can be released to the auxiliary electrode 33 through the third switch transistor 43 to establish the voltage difference between the first pixel electrode 31 and the second pixel electrode 32, such that the liquid crystals disposed respectively corresponding to the first pixel electrode 31 and the second pixel electrode 32 show different tilt angles, thereby improving the viewing angle of the liquid-crystal display panel and reducing color shift of the liquid-crystal display panel. The auxiliary electrode 33, the first pixel electrode 31, and the second pixel electrode 32 are made of the same material, which may exemplarily include indium tin oxide material. This may solve the existing aperture ratio lowered problem of liquid-crystal display panels in relating technologies, which means the adoption of the auxiliary electrode 33 reduces the color shift of the liquid-crystal display panel and also improves the aperture ratio of liquid-crystal display panels.

Figure 4:
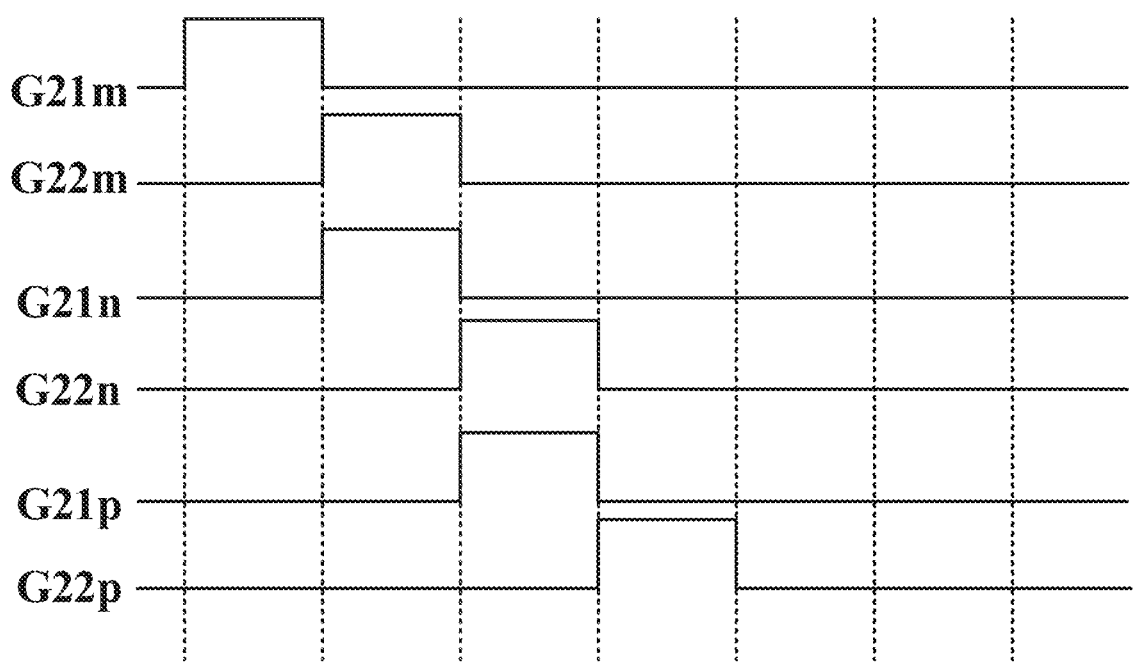
FIG. 4 is a timing diagram of the driving method shown in FIG. 1.

FIG. 4 is an exemplary timing diagram of the driving method shown in FIG. 1. In the combination of FIGS. 2-4, $G21m$, $G21n$, and $G21p$ are scan signals respectively on three arbitrary first scanning lines 21 of the display panel, and $G22m$, $G22n$, and $G22p$ are scan signals respectively on three second scanning lines 22 corresponding to the mentioned three first scanning lines. When performing a two dimensional display, a forward-scan mode is adopted, referring to FIG. 4, which means high voltage level pulses in the scan signals $G22m$, $G22n$, and $G22p$ on the second scanning line 22 travel behind high voltage level pulses in the scan signals $G21m$, $G21n$, and $G21p$ on the first scanning line 21, to control to achieve the preset voltage difference established between the first pixel electrode 31 and the second pixel electrode 32 through the auxiliary electrode 33 and, therefore, to solve the color shift problem of the display panel.

Optionally, the first switch transistor 41 may be a thin film transistor, the control electrode A1 of the first switch transistor 41 thus being the gate electrode of the thin film transistor, the first electrode A2 of the first switch transistor 41 being the drain electrode of the thin film transistor, and the second electrode A3 of the first switch transistor 41 being the source electrode of the thin film transistor.

Optionally, the second switch transistor 42 may also be a thin film transistor, the control electrode B1 of the second switch transistor 42 thus being the gate electrode of the thin film transistor, the first electrode B2 of the second switch transistor 42 being the drain electrode of the thin film transistor, and the second electrode B3 of the second switch transistor 42 being the source electrode of the thin film transistor.

Optionally, the first pixel electrode 31, the second pixel electrode 32, and the auxiliary electrode 33 may, as shown in FIG. 3, each be connected in parallel to at least one storage capacitor 51 located within a non-display area of the liquid-crystal display panel. FIG. 3 exemplarily shows the first pixel electrode 31, the second pixel electrode 32, and the auxiliary electrode 33 each connecting in parallel to the storage capacitor 51 respectively, and the adopted storage capacitors 51 can effectively avoid a voltage fluctuation on the first pixel electrode 31, the second pixel electrode 32, and the auxiliary electrode 33 to ensure working stability of the first pixel electrode 31, the second pixel electrode 32, and the auxiliary electrode 33. Disposing the capacitors 51 connecting in parallel to the first pixel electrode 31, the second pixel electrode 32, and the auxiliary electrode 33 within the non-display area of the liquid-crystal display panel can also avoid the impact of the storage capacitor 51 on the aperture ratio of the liquid-crystal display panel.

FIG. 5 is a schematic diagram showing a flow chart of another driving method of a display panel provided in the present embodiment. The driving method is applicable on a situation that requires driving a display panel to show a three dimensional display and can be implemented on a display panel provided in the present embodiment.

The method includes a step 210 of turning on the third switch transistor under control of the second scanning line, turning off the first switch transistor and the second switch transistor under control of the first scanning line, and controlling the common voltage signal line to input a common voltage signal to the auxiliary electrode through the third electrode of the third switch transistor when performing a three dimensional display operation.

Figure 6:
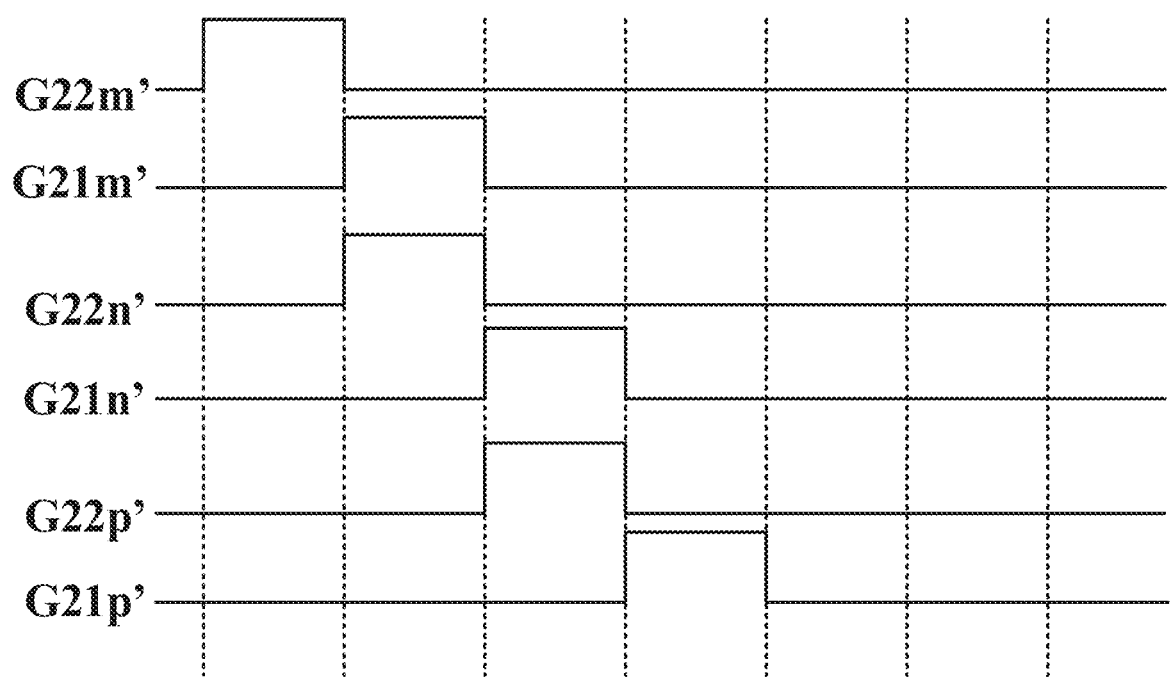
FIG. 6 is a timing diagram of the driving method shown in FIG. 5.

Different from the two dimensional display, a three dimensional display is proceeds by using a reverse-scan mode to drive the liquid-crystal display panel. FIG. 6 is a timing diagram of the driving method shown in FIG. 5, wherein G21$m'$, G21$n'$, and G21$p'$ are scan signals respectively on three arbitrary first scanning lines 21 of the display panel, and G22$m'$, G22$n'$, and G22$p'$ are scan signals respectively on three second scanning lines 22 corresponding to the mentioned three first scanning lines. Different from the two dimensional display, the three dimensional display adopts a reverse-scan mode, which means high voltage level pulses in the scan signals G22$m$, G22$n$, and G22$p$ on the second scanning line 22 travel in front of high voltage level pulses in the scan signals G21$m$, G21$n$, and G21$p$ on the first scanning line 21.

As exemplarily shown in FIG. 2, the first pixel electrode 31, the second pixel electrode 32, and the auxiliary electrode 33 can be sequentially disposed along a direction in parallel with the data line 11, and the projections of the second scanning line 22 and the third switch transistor 43 on the layer where the second pixel electrode 32 and the auxiliary electrode 33 are disposed can be positioned between the second pixel electrode 32 and the auxiliary electrode 33.

Figure 7:
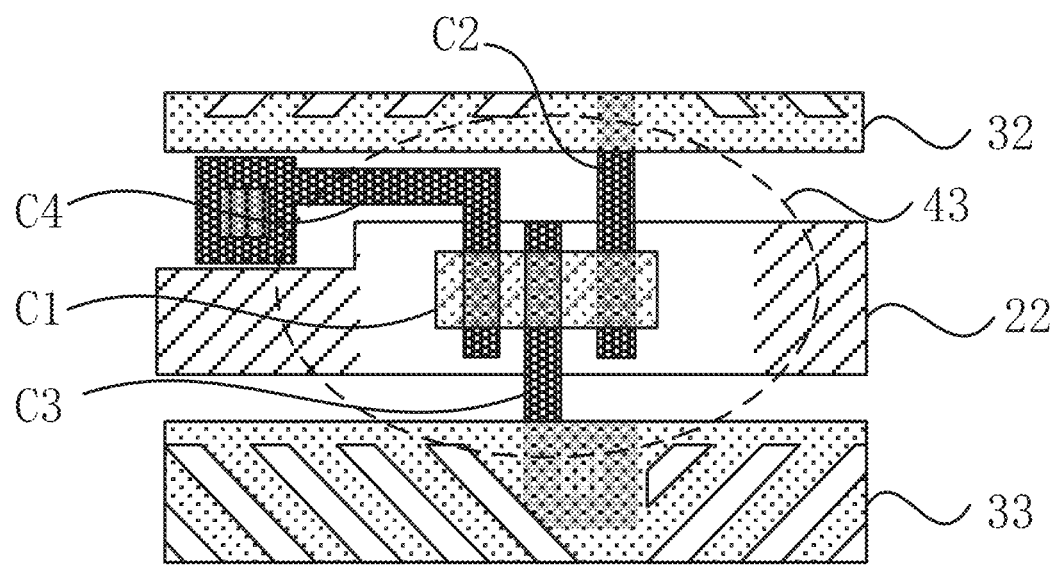
FIG. 7 is a schematic diagram showing a structure of a third switch transistor provided in the present embodiment.

As shown in FIG. 7, which is a schematic diagram showing an optional structure of the third switch transistor provided in the present embodiment, the third switch transistor 43 includes the control electrode C1, the first electrode C2, the second electrode C3, and a third electrode C4, and the array substrate can also include the common voltage signal line, which can be electrically connected to the third electrode C4. Based on a second signal of the second scanning line 22, the third switch transistor 43 can control the first electrode C2 to be in conduction with the second electrode C3 of the third switch transistor 43, which is to say that the second pixel electrode 32 is in conduction with the auxiliary electrode 33, or control the second electrode C3 to be in conduction with the third electrode C4, which is to say that the common voltage signal line is in conduction with the auxiliary electrode 33.

When the liquid-crystal display panel is performing a display operation, the data line 11 is electrically connected to the pixel electrode to provide a data signal to the corresponding pixel electrode, and while a common electrode has the common voltage signal at this moment, liquid crystal molecules are deflected under an electric field created between the pixel electrode and the common electrode, thereby carrying out the display function of the liquid-crystal display panel. It should be noted that the liquid-crystal display panel can be a normally-white type or a normally-black type. In the case of normally-white liquid-crystal display panels, when there is an electric field between the pixel electrode and the common electrode, the liquid crystals have the alignment directions the same as the direction of the electric field and do not optically rotate light. In the normally-white liquid-crystal display panels, the polarizers on each side of the liquid crystals have polarization transmitting directions orthogonal to one and another, and the pixel structure where the pixel electrode locates is in its dark state; when there is no electric field between the pixel electrode and the common electrode, the pixel structure where the pixel electrode locates is in its bright state. In the case of normally-black liquid-crystal display panels, the polarizers on each side of the liquid crystals have polarization transmitting directions parallel to one and another, and, thus, when there is an electric field between the pixel electrode and the common electrode, the pixel structure where the pixel electrode locates is in its bright state; when there is no electric field between the pixel electrode and the common electrode, the pixel structure where the pixel electrode locates is in its dark state. Although the liquid-crystal display panel in the present embodiment is not limited to a normally-black or normally-white type liquid-crystal display panel, the following will be set forth in the case of a normally-black liquid-crystal display panel for facilitating the description, but one skilled in the art should construe that the bright state and dark state of a pixel structure mentioned in the present embodiment are only relative to one and another.

In combination of FIG. 2 and FIG. 3, the third switch transistor 43 can firstly be turned on under control of the second scanning line 22, and the first switch transistor 41 and the second switch transistor 42 are turned off under control of the first scanning line 21, and the common voltage signal line can be in conduction with the second electrode C3 through the third electrode C4 of the third switch transistor 43, and the auxiliary electrode 33 and the common electrode both carry the common voltage signal and have no voltage difference between them, which means the electric field that controls to deflect the liquid crystal molecules between the common electrode and the auxiliary electrode 33 cannot be created, and the pixel structure where the auxiliary electrode 33 is located is in its dark state at the moment.

The method includes a step 220 of turning on the first switch transistor and the second switch transistor under control of the first scanning line, and turning off the third switch transistor under control of the second scanning line, so as to send a data signal from the data line through the first switch transistor and the second switch transistor to the first pixel electrode and the second pixel electrode, thereby driving the first pixel electrode and the second pixel electrode to display.

Referring to FIG. 2 and FIG. 3, the first scanning line 21 turns on the first switch transistor 41 and the second switch transistor 42, the second scanning line 22 turns off the third switch transistor 43, the data line 11 sends the data signal to the first pixel electrode 31 and the second pixel electrode 32, and a voltage difference is established between the first and the second pixel electrodes 31 and 32 and the common electrode, such that the pixel structures where the first pixel electrode 31 and the second pixel electrode 32 are located are in their bright state. As shown in FIG. 2, as the pixel structures where the first pixel electrode 31 and the second pixel electrode 32 are located are in their bright state, and the pixel structure where the auxiliary electrode 33 is located is in its dark state, the bright state pixel structures are separated by the dark state pixel structure along the direction in parallel with the data line 11 to increase the distance between the bright state pixel structures, thereby increasing the viewing angle of the liquid-crystal display panel when having a three dimensional display and improving crosstalk incidents caused by the short distance between the pixel electrodes located in the pixel structures.

Figure 8:
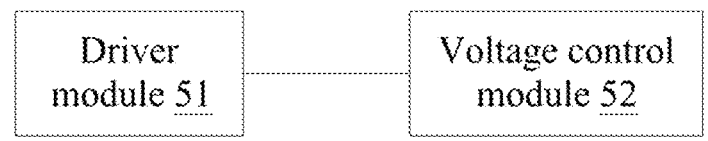
FIG. 8 is a schematic diagram showing a structure of a driving device of a display panel provided in the present embodiment.

FIG. 8 is a schematic diagram showing a structure of a driving device of a display panel provided in the present embodiment. As shown in FIG. 8, the driving device of the display panel includes a driver module 51 and a voltage control module 52. When performing the two dimensional display, the driver module 51 is configured to turn on a first switch transistor and a second switch transistor under control of a first scanning line, and to turn off a third switch transistor under control of a second scanning line, so as to have a data line input a data signal through the first switch transistor and the second switch transistor to a first pixel electrode and a second pixel electrode, thereby driving the first pixel electrode and the second pixel electrode to display in a pixel unit. The voltage control module 52 is configured to turn on the third switch transistor under control of the second scanning line, and to turn off the first switch transistor and the second switch transistor under control of the first scanning line, so as to have a portion of charge in the second pixel electrode transferred to an auxiliary electrode establish a preset voltage difference between the first pixel electrode and the second pixel electrode.

The display panel includes an array substrate and a color-filter substrate disposed opposite to the array substrate. The array substrate includes a plurality of data lines, a plurality of first scanning lines, a plurality of second scanning lines, a plurality of pixel units, a plurality of first switch transistors, a plurality of second switch transistors, and a plurality of third switch transistors, and each pixel unit includes a first pixel electrode, a second pixel electrode, and an auxiliary electrode made of the same material; the first switch transistor is arranged corresponding to the first pixel electrode, and the control electrode of the first switch transistor is electrically connected to the first scanning line, and a first electrode of the first switch transistor is electrically connected to one of the data lines, and a second electrode of the first switch transistor is electrically connected to a corresponding one of the first pixel electrodes; the second switch transistor is arranged corresponding to the second pixel electrode, and the control electrode of the second switch transistor is electrically connected to the first scanning line, and a first electrode of the second switch transistor is electrically connected to the data line electrically connected by the first switch transistor, and a second electrode of the second switch transistor is electrically connected to a corresponding one of the second pixel electrodes; the third switch transistor is arranged corresponding to the auxiliary electrodes, and the control electrode of the third switch transistor is electrically connected to the second scanning line, and a first electrode of the third switch transistor is electrically connected to the second pixel electrode of in same one of the pixel units, and a second electrode of the third switch transistor is electrically connected to a corresponding one of the auxiliary electrodes. A portion of charge on the second pixel electrode can be stored on the auxiliary electrode to establish a voltage difference between the first pixel electrode and the second pixel electrode, thereby fulfilling the purpose of reducing color shift, and the auxiliary electrode can be made of the same material as the first and the second pixel electrodes, thereby also avoiding the impact of the auxiliary electrode on aperture ratio of the liquid-crystal display panel.

Optionally, when performing a three dimensional display, the voltage control module 52 is also configured to turn on the third switch transistor under control of the second scanning line, and to turn off the first switch transistor and the second switch transistor under control of the first scanning line, so as to have a common voltage signal line inputting a common voltage signal to the auxiliary electrode through the third electrode of the third switch transistor; the driver module 51 is also configured to turn on the first switch transistor and the second switch transistor under control of the first scanning line, and to turn off the third switch transistor under control of the second scanning line, so as to control the input of a data signal from the data line to the first and the second pixel electrodes through the first switch transistor and the second switch transistor, thereby driving the first pixel electrode and the second pixel electrode to display in the pixel unit.

Figure 9:
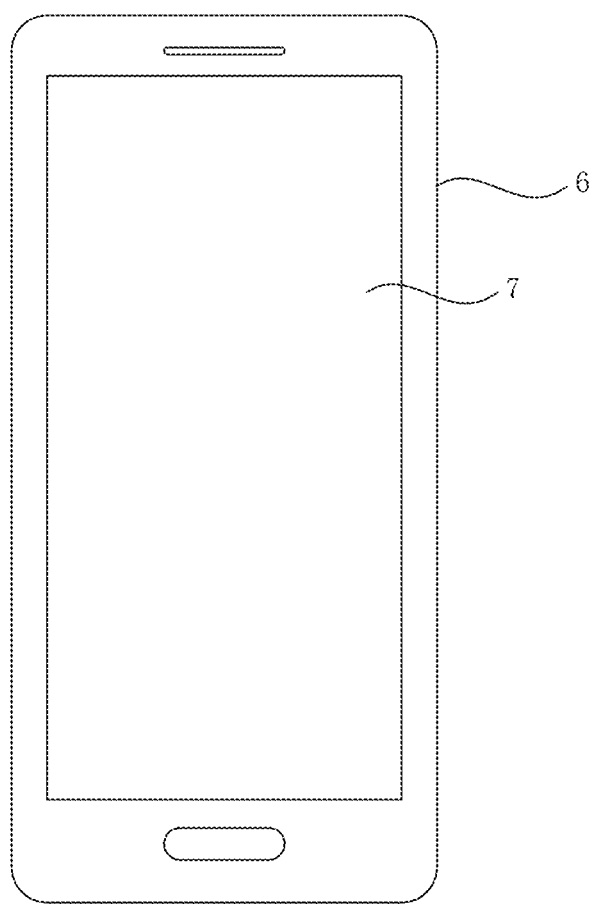
FIG. 9 is a schematic diagram showing a structure of a display device provided in the present embodiment.

On the basis of the aforementioned embodiments, FIG. 9 is a schematic diagram showing a structure of a display device provided in the present embodiment. As shown in FIG. 9, the display device 6 includes a display panel 7 and a driving device (not shown in the figure) and, as the driving device of the display panel in the aforementioned embodiment, has the same beneficial effects, which will not be reiterated. Exemplarily, the display device 6 can be, but is not limited to, a twisted nematic (TN) type, optically compensated birefringence (OCB), a vertical alignment (VA) type, or a curved-type liquid-crystal display panel. The liquid-crystal display device can adopt direct back-lit type backlight, and the backlight source can be, but is not limited to, white light, red-green-blue (RGB) three-color light, red-green-blue-white (RGBW) four-color light, or red-green-blue-yellow (RGBY) four-color light.

In the present embodiment, by turning on the first switch transistor and the second switch transistor under control of the first scanning line, and turning off the third switch transistor under control of the second scanning line, the data line inputs a data signal in the first pixel electrode and the second pixel electrode through the first switch transistor and the second switch transistor to drive the pixel structures where the first pixel electrode and the second pixel electrode are located to display; by turning on the third switch transistor under control of the second scanning line, and turning off the first switch transistor and the second switch transistor under control of the first scanning line, the first pixel electrode and the second pixel electrode establish a preset voltage difference between one and the other, wherein the first pixel electrode, the second pixel electrode, and the auxiliary electrode are arranged to be made of the same material. A portion of charge on the second pixel electrode can be stored on the auxiliary electrode to establish a voltage difference between the first pixel electrode and the second pixel electrode, thereby fulfilling the purpose of reducing color shift, and the auxiliary electrode can be made of the same material as the first and the second pixel electrodes, thereby also avoiding the impact of the auxiliary electrode on the aperture ratio of the liquid-crystal display panel.

The present embodiment also provides a computer readable storage medium, which can store computer executable instructions for carrying out the aforementioned methods.

Figure 10:
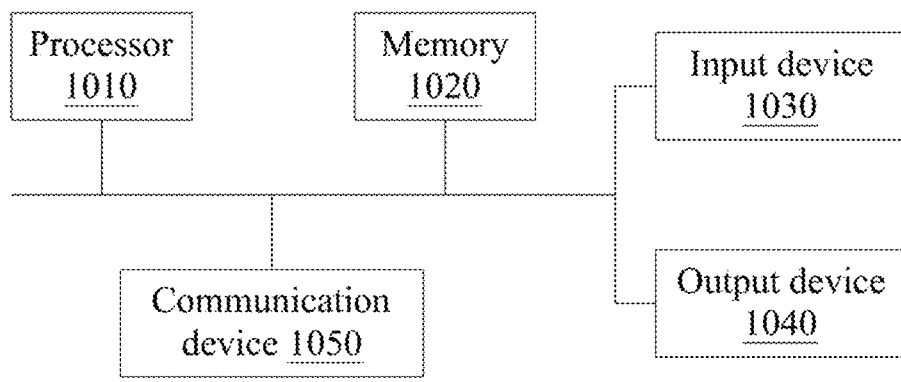
FIG. 10 is a schematic diagram showing a hardware structure of a driving device provided in the present embodiment.

As shown in FIG. 10, which is a schematic diagram showing a hardware structure of a driving device according to the present embodiment, the driving device includes one or more processors 1010 and a memory 1020. One processor 410 is used as an example in FIG. 10.

The driving device can also include an input device 1030 and an output device 1040.

The processor 1010, the memory 1020, the input device 1030, and the output device 1040 of the driving device can be coupled through a bus, as an example shown in FIG. 10, or by any other means.

The input device 1030 can accept inputted digit or character information, and the output device 1030 can include a display device such as a display panel.

The memory 1020, as a computer readable storage medium, can store software programs, computer executable programs, and modules. The processor 1010 runs the software programs, instructions, and modules stored in the memory 1020 so as to carry out multiple functional applications and process data, thereby enforcing any methods in the aforementioned embodiments.

The memory 1020 can include a program storage area and a data storage area, wherein the program storage area can store an operating system, at least one function application required, and the data storage area can store generated data based on the usage of the driving device. In addition, the memory can include a volatile memory such as a random access memory (RAM), and the memory can also include a non-volatile memory such as at least one magnetic disk memory, a flash memory, or any other non-transitory solid-state memories.

The memory 1020 can be a non-transitory computer storage medium or a transitory computer storage medium. the non-transitory computer storage medium can be, for example, at least one magnetic disk memory, a flash memory, or any other nonvolatile solid-state memories. In some embodiments, the memory 1020 can optionally include a memory remote to the processor 1010, and these remote storage memories can connect to the driving device via a network. The network can practically include the Internet, a corporate intranet, a local area network, a mobile communication network, or a combination thereof.

The input device 1030 can be used to accept inputted digit or character information and generates key signal inputs related to user configurations and functional controls of the driving device. The output device 1040 can include a display device such as a display panel.

The driving device of the present embodiment can further include a communication device 1050 transmitting and/or receiving information via communication network.

One with ordinary skills in the art can understand that the procedures in the methods of the aforementioned embodiments can be fully or partially accomplished by hardware operations commanded by computer programs, which can be stored in a non-transitory computer readable storage medium, and when being executed, the programs can include the procedures such as those mentioned in the methods of the embodiments, wherein the non-transitory computer readable storage medium can be a magnetic disc, an optical disk, a read-only memory (ROM), or a random access memory (RAM).

What is claimed is:

1. A driving method of a display panel, the display panel comprising a plurality of pixels, each of the pixels comprising:
  a data line;
  a first scanning line;
  a of second scanning line;
  a pixel unit comprising a first pixel electrode, a second pixel electrode, and an auxiliary electrode made of a same material;
  a first switch transistor disposed corresponding to the first pixel electrode, wherein a control electrode of the first switch transistor is electrically connected to the first scanning line, and a first electrode of the first switch transistor is electrically connected to the data line, and a second electrode of the first switch transistor is electrically connected to the first pixel electrode;
  a second switch transistor disposed corresponding to the second pixel electrode, wherein a control electrode of the second switch transistor is electrically connected to the first scanning line, and a first electrode of the second switch transistor is electrically connected to the data line electrically connected by the first switch transistor, and a second electrode of the second switch transistor is electrically connected to a corresponding one of the second pixel electrodes;
  a third switch transistor disposed corresponding to the auxiliary electrode, wherein a control electrode of the third switch transistor is electrically connected to the second scanning line, and a first electrode of the third switch transistor is electrically connected to the second pixel electrode of the pixel unit, and a second electrode of the third switch transistor is electrically connected to of the auxiliary electrode;
  the driving method comprising:
    when performing a two dimensional display, turning on the first switch transistor and the second switch transistor under control of the first scanning line, and turning off the third switch transistor under control of the second scanning line, such that the data line inputs a data signal to the first pixel electrode and the second pixel electrode through the first switch transistor and the second switch transistor, thereby driving the first pixel electrode and the second pixel electrode in the pixel unit to display in the pixel unit; and
    turning on the third switch transistor under control of the second scanning line such that the second pixel electrode is in conduction with the auxiliary electrode, and turning off the first switch transistor and the second switch transistor under control of the first scanning line, such that a portion of charges in the second pixel electrode is transferred to the auxiliary electrode, thereby establishing a preset voltage difference between the first pixel electrode and the second pixel electrode;
  when performing a three dimensional display, turning on the third switch transistor under control of the second scanning line, turning off the first switch transistor and the second switch transistor under control of the first scanning line, and controlling a common voltage signal line to input a common voltage signal to the auxiliary electrode through a third electrode of the third switch transistor;
  turning on the first switch transistor and the second switch transistor under control of the first scanning line, turning off the third switch transistor under control of the second scanning line, inputting the data signal from the data line to the first pixel electrode and the second pixel electrode through the first switch transistor and the second switch transistor, and driving the first pixel electrode and the second pixel electrode to carry to display in the pixel unit.

2. A driving device of a display panel, comprising:
a driver turning on a first switch transistor and a second switch transistor under control of a first scanning line, and turning off a third switch transistor under control of a second scanning line, when performing a two dimensional display, such that a data line inputs a data signal to a first pixel electrode and a second pixel electrode through the first switch transistor and the second switch transistor, thereby driving the first pixel electrode and the second pixel electrode to display in a pixel unit; and
a voltage controller turning on the third switch transistor under control of the second scanning line, and turning off the first switch transistor and the second switch transistor under control of the first scanning line, such that a portion of charges in the second pixel electrode is transferred to an auxiliary electrode, thereby establishing a preset voltage difference between the first pixel electrode and the second pixel electrode;
wherein the display panel comprises an array substrate comprising:
  a plurality of the data lines;
  a plurality of the first scanning lines;
  a plurality of the second scanning lines;
  a plurality of the pixel units, wherein each of the pixel units comprises the first pixel electrode, the second pixel electrode, and the auxiliary electrode made of a same material;
  a plurality of the first switch transistors disposed corresponding to the first pixel electrodes, wherein a control electrode of the first switch transistor is electrically connected to the first scanning line, and a first electrode of the first switch transistor is electrically connected to the data line, and a second electrode of the first switch transistor is electrically connected to a corresponding one of the first pixel electrodes;
    a plurality of the second switch transistors disposed corresponding to the second pixel electrodes, wherein a[[the]] control electrode of the second switch transistor is electrically connected to the first scanning line, and a first electrode of the second switch transistor is electrically connected to the data line electrically connected by the first switch transistor, and a second electrode of the second switch transistor is electrically connected to a corresponding one of the second pixel electrodes;
  a plurality of the third switch transistors disposed corresponding to the auxiliary electrodes, wherein a control electrode of the third switch transistor is electrically connected to the second scanning line, and a first electrode of the third switch transistor is electrically connected to the second pixel electrode of a same one of the pixel units, and a second electrode of the third switch transistor is electrically connected to a corresponding one of the auxiliary electrodes;
wherein projections of the second scanning line and the third switch transistor on a layer where the second pixel electrode and the auxiliary electrode are disposed are positioned between the second pixel electrode and the auxiliary electrode.

3. The driving device of claim 2, wherein the first pixel electrode, the second pixel electrode, and the auxiliary electrode are sequentially disposed along a direction parallel to the data line.

4. The driving device of claim 2, wherein the array substrate further comprises a plurality of common voltage signal lines, and the third switch transistor further comprises a third electrode electrically connected to a corresponding one of the plurality of common voltage signal lines, and based on a second scan signal of the second scanning line, the third switch transistor controls the first electrode and the second electrode of the third switch transistor to be in conduction and to control the second electrode and the third electrode to be in conduction.

5. The driving device of claim 4, wherein when performing a three-dimensional display, the voltage controller further turns on the third switch transistor under control of the second scanning line, and turns off the first switch transistor and the second switch transistor under control of the first scanning line to control the corresponding one of the plurality of common voltage signal lines to input a common voltage signal to the auxiliary electrode through the third electrode of the third switch transistor, and
  the driver further turns on the first switch transistor and the second switch transistor under control of the first scanning line, and turns off the third switch transistor under control of the second scanning line, to control the data line to input a data signal to the first pixel electrode and the second pixel electrode through the first switch transistor and the second switch transistor, thereby driving the first pixel electrode and the second pixel electrode to display in the pixel unit.

6. The driving device of claim 2, wherein the first switch transistor is a thin film transistor, and the control electrode of the first switch transistor is a gate electrode of the thin film transistor, the first electrode of the first switch transistor is a drain electrode of the thin film transistor, and the second electrode of the first switch transistor is a source electrode of the thin film transistor.

7. The driving device of claim 2, wherein the second switch transistor is a thin film transistor, and the control electrode of the second switch transistor is a gate electrode of the thin film transistor, the first electrode of the second switch transistor is a drain electrode of the thin film transistor, and the second electrode of the second switch transistor is a source electrode of the thin film transistor.

8. The driving device of claim 2, wherein the material of the first pixel electrode, the second pixel electrode, and the auxiliary electrode includes indium tin oxide.

9. A driving device of a display panel, comprising:
  a driver turning on a first switch transistor and a second switch transistor under control of a first scanning line and turning off a third switch transistor under control of a second scanning line, when performing a two dimensional display, such that a data line inputs a data signal to a first pixel electrode and a second pixel electrode through the first switch transistor and the second switch transistor, thereby driving the first pixel electrode and the second pixel electrode to display in a pixel unit; and
  a voltage controller turning on the third switch transistor under control of the second scanning line and turning off the first switch transistor and the second switch transistor under control of the first scanning line to have a portion of charge in the second pixel electrode transferred to an auxiliary electrode, thereby establishing a preset voltage difference between the first pixel electrode and the second pixel electrode;

wherein the display panel comprises an array substrate, comprising:
- a plurality of the data lines;
- a plurality of the first scanning lines;
- a plurality of the second scanning lines;
- a plurality of the pixel units, wherein each of the pixel units comprises the first pixel electrode, the second pixel electrode, and the auxiliary electrode made of a same material;
- a plurality of the first switch transistors disposed corresponding to the first pixel electrodes, wherein a control electrode of the first switch transistor is electrically connected to the first scanning line, and a first electrode of the first switch transistor is electrically connected to the data line, and a second electrode of the first switch transistor is electrically connected to a corresponding one of the first pixel electrodes;
- a plurality of the second switch transistors disposed corresponding to the second pixel electrodes, wherein a control electrode of the second switch transistor is electrically connected to the first scanning line, and a first electrode of the second switch transistor is electrically connected to the data line electrically connected by the first switch transistor, and a second electrode of the second switch transistor is electrically connected to a corresponding one of the second pixel electrodes;
- a plurality of the third switch transistors disposed corresponding to the auxiliary electrodes, wherein a control electrode of the third switch transistor is electrically connected to the second scanning line, and a first electrode of the third switch transistor is electrically connected to the second pixel electrode of a same one of the pixel units, and a second electrode of the third switch transistor is electrically connected to a corresponding one of the auxiliary electrodes;

wherein the first pixel electrode, the second pixel electrode, and the auxiliary electrode are respectively connected in parallel to at least one capacitor disposed in a non-display area of the display panel;

wherein projections of the second scanning line and the third switch transistor on a layer where the second pixel electrode and the auxiliary electrode are disposed are positioned between the second pixel electrode and the auxiliary electrode.

10. The driving device of claim 9, wherein the first pixel electrode, the second pixel electrode, and the auxiliary electrode are sequentially disposed along a direction parallel to the data line.

11. The driving device of claim 9, wherein the array substrate further comprises a plurality of common voltage signal lines, and the third switch transistor further comprises a third electrode electrically connected to a corresponding one of the plurality of common voltage signal lines, and based on a second scan signal of the second scanning line, the third switch transistor controls the first electrode and the second electrode of the third switch transistor to be in conduction and to control the second electrode and the third electrode to be in conduction.

12. The driving device of claim 11, wherein when performing a three-dimensional display, the voltage controller turns on the third switch transistor under control of the second scanning line, and turns off the first switch transistor and the second switch transistor under control of the first scanning line, to control the corresponding one of the plurality of common voltage signal lines to input a common voltage signal to the auxiliary electrode through the third electrode of the third switch transistor, and the driver turns on the first switch transistor and the second switch transistor under control of the first scanning line, and turns off the third switch transistor under control of the second scanning line, thereby controlling the data line to input a data signal to the first pixel electrode and the second pixel electrode through the first switch transistor and the second switch transistor to the first pixel electrode and the second pixel electrode to display in the pixel unit.

13. The driving device of claim 9, wherein the first switch transistor is a thin film transistor, and the control electrode of the first switch transistor is a gate electrode of the thin film transistor, and the first electrode of the first switch transistor is a drain electrode of the thin film transistor, and the second electrode of the first switch transistor is a source electrode of the thin film transistor.

14. The driving device of claim 9, wherein the second switch transistor is a thin film transistor, and the control electrode of the second switch transistor is a gate electrode of the thin film transistor, and the first electrode of the second switch transistor is a drain electrode of the thin film transistor, and the second electrode of the second switch transistor is a source electrode of the thin film transistor.

15. The driving device of claim 9, wherein the material that the first pixel electrode, the second pixel electrode, and the auxiliary electrode are made of includes indium tin oxide.

* * * * *